United States Patent
Niu et al.

(10) Patent No.: US 10,741,793 B2
(45) Date of Patent: Aug. 11, 2020

(54) LIGHT EMITTING DEVICE INCLUDING BLUE EMITTING QUANTUM DOTS AND METHOD

(71) Applicant: SAMSUNG RESEARCH AMERICA, INC., Mountain View, CA (US)

(72) Inventors: Yuhua Niu, Waltham, MA (US); Peter T. Kazlas, Sudbury, MA (US)

(73) Assignee: SAMSUNG RESEARCH AMERICA, INC., Mountain View, CA (US)

(*) Notice: Subject to any disclaimer, the term of this patent is extended or adjusted under 35 U.S.C. 154(b) by 0 days.

(21) Appl. No.: 14/323,900

(22) Filed: Jul. 3, 2014

(65) Prior Publication Data

US 2015/0028305 A1 Jan. 29, 2015

Related U.S. Application Data

(63) Continuation of application No. PCT/US2012/063724, filed on Nov. 6, 2012.
(Continued)

(51) Int. Cl.
*H01L 51/52* (2006.01)
*H01L 51/56* (2006.01)
(Continued)

(52) U.S. Cl.
CPC ........ *H01L 51/5262* (2013.01); *C09K 11/025* (2013.01); *C09K 11/565* (2013.01);
(Continued)

(58) Field of Classification Search
None
See application file for complete search history.

(56) References Cited

U.S. PATENT DOCUMENTS

| 4,907,043 A | 3/1990 | Uekita et al. |
| 7,160,613 B2 | 1/2007 | Bawendi et al. |

(Continued)

FOREIGN PATENT DOCUMENTS

| EP | 1843411 A1 | 10/2007 |
| KR | 10-2010-0112454 | 10/2010 |

(Continued)

OTHER PUBLICATIONS

Su, Peng-Yin, et al. "Low-frequency noise properties of metal-organic-metal ultraviolet sensors." Japanese Journal of Applied Physics 54.4S (2015): 04DK12.*

(Continued)

*Primary Examiner* — Walter H Swanson
*Assistant Examiner* — Kien C Ly
(74) *Attorney, Agent, or Firm* — Cantor Colburn LLP (57) ABSTRACT

A method for preparing a light emitting device comprising: disposing an electron-injection layer comprising a metal oxide on a cathode, disposing a first layer adjacent the electron-injection layer, the first layer comprising a small molecule material with a bandgap of at least about 3 eV capable of blocking holes, forming an emissive layer comprising quantum dots capable of emitting blue light upon excitation at a surface of the first layer opposite the electron-injection layer; disposing a second layer comprising a material capable of transporting holes and blocking electrons with a bandgap of at least about 3 eV adjacent a surface of the emissive layer opposite the first layer, and disposing an anode over the second layer. A light-emitting device is also disclosed.

23 Claims, 4 Drawing Sheets

Normalized EL spectra

Related U.S. Application Data (60) Provisional application No. 61/584,217, filed on Jan. 6, 2012.

(51) Int. Cl.

| | | |
|---|---|---|
| *C09K 11/56* | (2006.01) | |
| *C09K 11/02* | (2006.01) | |
| *H05B 33/10* | (2006.01) | |
| *H01L 51/50* | (2006.01) | |
| *H05B 33/12* | (2006.01) | |
| *H01L 51/00* | (2006.01) | |

(52) U.S. Cl.
CPC ............ *H01L 51/502* (2013.01); *H01L 51/56* (2013.01); *H05B 33/10* (2013.01); *H05B 33/12* (2013.01); *H01L 51/0026* (2013.01); *H01L 51/5088* (2013.01); *H01L 51/5092* (2013.01); *H01L 51/5096* (2013.01); *H01L 2251/5353* (2013.01); *H01L 2251/5369* (2013.01); *H01L 2251/55* (2013.01); *H01L 2251/556* (2013.01); *H01L 2251/558* (2013.01)

(56) References Cited

U.S. PATENT DOCUMENTS

| | | |
|---|---|---|
| 7,332,211 B1 | 2/2008 | Bulovic et al. |
| 7,615,800 B2 | 11/2009 | Kahen et al. |
| 8,404,154 B2 | 3/2013 | Breen et al. |
| 8,906,265 B2 | 12/2014 | Breen et al. |
| 9,054,329 B2 | 6/2015 | Coe-Sullivan et al. |
| 9,496,141 B2 | 11/2016 | Kazlas et al. |
| 9,520,573 B2 | 12/2016 | Zhou et al. |
| 9,525,148 B2 | 12/2016 | Kazlas et al. |
| 9,534,172 B2 | 1/2017 | Breen et al. |
| 2004/0023010 A1 | 2/2004 | Bulovic et al. |
| 2004/0251467 A1* | 12/2004 | Nakamura .......... H01L 51/0069 257/79 |
| 2005/0258418 A1 | 11/2005 | Steckel et al. |
| 2006/0043361 A1 | 3/2006 | Lee et al. |
| 2006/0196375 A1 | 9/2006 | Coe-Sullivan et al. |
| 2006/0231843 A1* | 10/2006 | Qin .................... H01L 51/5016 257/79 |
| 2007/0001581 A1 | 1/2007 | Stasiak et al. |
| 2007/0069202 A1 | 3/2007 | Choi et al. |
| 2007/0103068 A1 | 5/2007 | Bawendi et al. |
| 2008/0001167 A1 | 1/2008 | Coe-Sullivan et al. |
| 2008/0171484 A1* | 7/2008 | Yamashita ........ G02F 1/133305 445/24 |
| 2008/0203895 A1 | 8/2008 | Miller et al. |
| 2008/0217602 A1 | 9/2008 | Kahen et al. |
| 2008/0238299 A1* | 10/2008 | Cho ...................... B82Y 20/00 313/503 |
| 2008/0309234 A1 | 12/2008 | Cho et al. |
| 2009/0039764 A1 | 2/2009 | Cho et al. |
| 2009/0066223 A1 | 3/2009 | Yabe et al. |
| 2009/0162011 A1 | 6/2009 | Coe-Sullivan et al. |
| 2009/0181478 A1 | 7/2009 | Cox et al. |
| 2009/0215208 A1 | 8/2009 | Coe-Sullivan et al. |
| 2009/0278141 A1 | 11/2009 | Coe-Sullivan et al. |
| 2009/0314991 A1* | 12/2009 | Cho ...................... C09D 11/36 252/301.36 |
| 2010/0001256 A1 | 1/2010 | Coe-Sullivan et al. |
| 2010/0044635 A1 | 2/2010 | Breen et al. |
| 2010/0045175 A1* | 2/2010 | Mathai ................ H01L 27/3209 313/504 |
| 2010/0051901 A1 | 3/2010 | Kazlas et al. |
| 2010/0132770 A1 | 6/2010 | Beatty et al. |
| 2010/0258789 A1* | 10/2010 | Akai .................... C09K 11/025 257/40 |
| 2010/0258797 A1* | 10/2010 | Yamamoto .......... H01L 51/5092 257/43 |
| 2010/0265307 A1 | 10/2010 | Linton et al. |
| 2010/0283014 A1 | 11/2010 | Breen et al. |
| 2011/0012141 A1* | 1/2011 | Le Toquin ............ H01L 33/502 257/89 |
| 2011/0025224 A1 | 2/2011 | Wood et al. |
| 2011/0080090 A1 | 4/2011 | Wood et al. |
| 2011/0101479 A1 | 5/2011 | Arango et al. |
| 2011/0127932 A1 | 6/2011 | Halpert et al. |
| 2011/0140075 A1* | 6/2011 | Zhou ..................... B82Y 20/00 257/13 |
| 2011/0227036 A1 | 9/2011 | Vaufrey |
| 2011/0245533 A1 | 10/2011 | Breen et al. |
| 2011/0291071 A1 | 12/2011 | Kim et al. |
| 2012/0138894 A1 | 6/2012 | Qian et al. |
| 2012/0292594 A1 | 11/2012 | Zhou et al. |
| 2013/0009131 A1 | 1/2013 | Kazlas et al. |
| 2013/0037778 A1* | 2/2013 | Kazlas .................. B82Y 10/00 257/9 |
| 2015/0001528 A1 | 1/2015 | Niu et al. |
| 2015/0236078 A1* | 8/2015 | Afzali-Ardakani ......................... H01L 27/3225 257/40 |

FOREIGN PATENT DOCUMENTS

| | | |
|---|---|---|
| KR | 10-0990451 | 10/2010 |
| KR | 10-2011-0129121 | 12/2011 |
| WO | WO2006088877 A1 | 8/2006 |
| WO | WO2008063652 A1 | 5/2008 |
| WO | WO2008063657 A2 | 5/2008 |
| WO | WO2009123763 A2 | 10/2009 |
| WO | WO2011044391 A1 | 4/2011 |
| WO | WO2011060180 A1 | 5/2011 |
| WO | WO2012158252 A1 | 11/2012 |
| WO | WO2013103440 A1 | 7/2013 |

OTHER PUBLICATIONS

Cheng, L. F., et al. "Photoemission study of a new electroluminescent material: trimer of N-arylbenzimidazoles (TPBI)." Displays 21.2 (2000): 51-54.*

Blochwitz, et al., "Interface Electronic Structure of Organic Semiconductors With Controlled Doping Levels", *Organic Electronics* (2001), vol. 2, pp. 97-104.

Bulovic, V. et al., "Transparent light-emitting devices", *Nature* (1996), vol. 380, p. 29.

Carlson, et al., "Valence Band Alignment at Cadmium Selenide Quantum Dot and Zinc Oxide (1010) Interfaces", *J. Phys. Chem. C* (2008), 112, pp. 8419-8423.

Carter, et al., "Enhanced luminance in polymer composite light emitting devices", *Appl. Phys. Lett.* 71 (9), (1997).

Caruge, J.M. et al., "Colloidal Quantum-Dot Light-Emitting Diodes with Metal Oxide Charge Transport Layers", Nature Photonics, Apr. 2008, vol. 2, pp. 247-250.

Chan, C., et al., "Contact Potential Difference Measurements of Doped Organic Molecular Thin Films", *J. Vac, Sci. Technol. A* (2004), vol. 22, No. 4, pp. 1488-1492.

Cho, K-S, et al., "High-performance crosslinked colloidal quantum-dot light emitting diodes", Nature Photonics, Published Online:May 24, 2009, 5 pages.

Coe-Sullivan, S., et al., "Large-Area Ordered Quantum-Dot Monolayers via Phase Separation During Spin-Casting", *Adv. Funct. Mater.*, vol. 15 (2005), pp. 1117-1124.

Coe-Sullivan, S., "Hybrid Organic/Quantum Dot Thin Film Structures and Devices", MIT Thesis in partial fulfillment of Ph.D. in Electrical Engineering and Computer Science (2005).

Coe-Sullivan, S., et al., "Method for fabrication of saturated RGB quantum dot light emitting devices", Proc. of SPIE, vol. 5739, 2005, pp. 108-115.

Dabbousi, B.O., et al., "(CdSe) ZnS Core-Shell Quantum Dots: Synthesis and Characterization of a Size Series of Highly Luminescent Nanocrystallites", *J. Phys. Chem.* (1997), vol. 101, pp. 9463-9475.

Gu, G. et al., "Transparent organic light emitting devices", *Appl. Phys. Lett.* (1996) vol. 68, pp. 2606-2608.

(56) References Cited

OTHER PUBLICATIONS

Huang, H. et al., :Bias-Induced Photoluminescence Quenching of Single Colloidal Quantum Dots Embedded in Organic Semiconductors, Nano Lett., 2007, 7 (12), 3781-3786.

Ichikawa, et al., "Bipyridyl oxadiazoles as efficient and durable electron-transporting and hole-blocking molecular materials",J. Mater. Chem., 2006, 16, 221-25.

Kang, H.S., et al., "Variation of light emitting properties of ZnO thin films depending on post-annealing temperature", *Mater. Sci. Eng. B* (2003), vol. 102, pp. 313-316.

Mashford, B.S., et al., "All-inorganic quantum-dot light-emitting devices formed via low-cost, wet-chemical processing", J. Mater. Chem. 20, 167-172 (2010).

Mashford, B.S., et al., "High-efficiency quantum-dot light-emitting devices with enhanced charge injection", *Nature Photonics* 7, pp. 407-412 (2013).

Niu, Y-H, et al., "Improved Performance from Multilayer Quantum Dot Light-Emitting Diodes via Thermal Annealing of the Quantum Dot Layer", Adv. Mater. (2007), vol. 19, pp. 3371-3376.

PCT Search Report and Written Opinion dated Feb. 27, 2013 for International Application No. PCT/US2012/063724, which is the parent application of this case.

Schmechel, R., "A theoretical approach to the hopping transport in p-doped zinc-phthalocyanine", 48, Internationales Wissenschaftliches Kolloquium, Technische Universtaat ilmenau, Sep. 22-25, 2003, (2 pages).

Steckel, J.S., et al., "Blue Luminescence from (CdS)ZnS Core-Shell nanocrsytals", Angew. Chem. Int. Ed., 43: pp. 2154-2158 (2004).

Stouwdam, J.W., et al., "Red, green, and blue quantum dot LEDs with solution processable ZnO nanocrystal electron injection layers", 2008 Journal of Materials Chemistry, vol. 18, p. 1889-1894.

Talapin, D.V., et al., "Prospects of colloidal nanocrystals for electronic and optoelectronic applications" Chem. Reviews, 2010, vol. 110 pp. 389-458.

Wood, V. et al., "Selection of Metal Oxide Charge Transport Layers for Colloidal Quantum Dot LEDs", ACS Nano, 2009, 3 (11), pp. 3581-3586.

Wood, V., et al., "Efficient All-Inorganic Colloidal Quantum Dot LEDs," Lasers and Electro-Optics, 2007. CLEO 2007. Conference on , vol., No., pp. 1,2, May 6-11, 2007. (Optical Society of America, 2007), paper CMO1. See, in particular, Section 3.

* cited by examiner

FIG. 1

Normalized EL spectra

FIG. 2A

Current density (mA/cm²), brightness (Cd/m²) under different driving voltage

FIG. 2B

Brightness (Cd/m$^2$), luminous efficiency (Cd/A) at different Current density (mA/cm$^2$)

FIG. 2C

LIGHT EMITTING DEVICE INCLUDING BLUE EMITTING QUANTUM DOTS AND METHOD

This application is a continuation of International Application No. PCT/US2012/063724, filed 6 Nov. 2012, which was published in the English language as International Publication No. WO 2013/103440 on 11 Jul. 2013, which International Application claims priority to U.S. Provisional Patent Application No. 61/584,217 filed 6 Jan. 2012. Each of the foregoing is hereby incorporated herein by reference in its entirety for all purposes.

FEDERALLY SPONSORED RESEARCH OR DEVELOPMENT

This invention was made with Government support under Advanced Technology Program Award No. 70NANB7H7056 awarded by NIST and with Government support under Contract No. FA9550-07-C-0056 awarded by the United States Air Force. The United States has certain rights in the invention.

TECHNICAL FIELD OF THE INVENTION

The present invention relates to the technical field of devices including quantum dots.

SUMMARY OF THE INVENTION

In accordance with the present invention there is provided a method for preparing a light emitting device comprising: disposing an electron-injection layer comprising a metal oxide on a cathode, disposing a first layer adjacent the electron-injection layer, the first layer comprising a small molecule material with a bandgap of at least about 3 eV capable of blocking holes, forming an emissive layer comprising quantum dots capable of emitting blue light upon excitation at a surface of the first layer opposite the electron-injection layer; disposing a second layer comprising a material capable of transporting holes and blocking electrons with a bandgap of at least about 3 eV adjacent a surface of the emissive layer opposite the first layer, and disposing an anode over the second layer.

Preferably the method further comprises heat treating the partial device after formation of the emissive layer, prior to inclusion of another layer thereover.

In certain embodiments, the method further comprises disposing a third layer comprising a material capable of transporting holes over the second layer before inclusion of the anode.

In certain embodiments, the method further comprises disposing a hole injection layer over the uppermost layer prior to including the anode.

In certain embodiment, the method further includes encapsulating the device.

In certain preferred embodiments the electron-injection layer comprises zinc oxide.

In certain embodiments, the second layer comprises a small molecule material.

In certain embodiments, the third layer comprises a small molecule material.

In certain embodiments, the first layer is sufficiently thick to inhibit emission from device materials other than quantum dots.

In certain embodiments, the first layer has a thickness greater than 25 nm.

In certain preferred embodiments, the emissive layer is formed by phase separation of the quantum dots capable of emitting blue light upon excitation from the small molecule material included in the first layer.

In accordance with another aspect of the present invention, there is provided a light emitting device prepared in accordance with a method described herein.

In certain embodiments of the device, the CIE x and y coordinates of blue light emitted from the quantum dots are less than about 0.15 and less than about 0.1, respectively.

In accordance with another aspect of the present invention, there is provided a light emitting device comprising: an electron-injection layer comprising a metal oxide disposed on a cathode, a first layer disposed adjacent the electron-injection layer, the first layer comprising a small molecule material with a bandgap of at least about 3 eV capable of blocking holes, an emissive layer comprising quantum dots capable of emitting blue light upon excitation disposed at a surface of the first layer opposite the electron-injection layer; a second layer comprising a material capable of transporting holes and blocking electrons with a bandgap of at least about 3 eV disposed adjacent a surface of the emissive layer opposite the first layer, and an anode disposed over the second layer.

Preferably the emissive layer is annealed prior to inclusion of another layer thereover.

In certain embodiments, the device further comprises a third layer comprising a material capable of transporting holes disposed over the second layer before inclusion of the anode.

In certain embodiments, the device further comprises a hole injection layer disposed over the uppermost layer prior to including the anode.

In certain preferred embodiments the electron-injection layer comprises zinc oxide.

In certain embodiments, the first layer is sufficiently thick to inhibit emission from device materials other than quantum dots.

In certain embodiments, the first layer has a thickness greater than 25 nm.

In certain preferred embodiments, the emissive layer is formed by phase separation of the quantum dots capable of emitting blue light upon excitation from the small molecule material included in the first layer.

In certain embodiments of the inventions described herein, an electron-injection layer can comprise a stratified structure including two or more horizontal zones or layers.

In certain embodiments of the inventions described herein, a layer can comprise one or more separate layers.

In certain embodiments of the inventions described herein, one or more additional layers (e.g., but not limited to, charge injection, charge blocking, etc.) can be included in the device.

In certain embodiments of the inventions described herein, the material capable of transporting holes and blocking electrons comprises an inorganic material.

In certain embodiments of the inventions described herein, the material capable of transporting holes and blocking electrons comprises an organic material.

In certain embodiments of the inventions described herein, the material capable of transporting holes comprises an inorganic material.

In certain embodiments of the inventions described herein, the material capable of transporting holes comprises an organic material.

In certain embodiments of the inventions described herein, the second layer comprises a small molecule material.

In certain embodiments of the inventions described herein, the third layer comprises a small molecule material.

In certain embodiments of the inventions described herein, an electron-injection layer comprises titanium dioxide.

In certain embodiments of the inventions described herein, an electron-injection layer comprises zinc oxide.

In certain embodiments of the inventions described herein, an electron-injection layer comprises a mixture of zinc oxide and titanium oxide.

In accordance with another aspect of the invention, there are provided displays and other products including the above-described light-emitting device.

Other aspects and embodiments of the invention relate to materials and methods that are useful in making the above described devices.

The foregoing, and other aspects described herein, all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the description and drawings, from the claims, and from practice of the invention disclosed herein.

For a better understanding to the present invention, together with other advantages and capabilities thereof, reference is made to the following disclosure and appended claims in connection with the above-described drawings.

DETAILED DESCRIPTION OF THE INVENTION

In accordance with the present invention there is provided a method for preparing a light emitting device comprising: disposing an electron-injection layer comprising a metal oxide on a cathode, disposing a first layer adjacent the electron-injection layer, the first layer comprising a small molecule material with a bandgap of at least about 3 eV capable of blocking holes, forming an emissive layer comprising quantum dots capable of emitting blue light upon excitation at a surface of the first layer opposite the electron-injection layer; disposing a second layer comprising a material capable of transporting holes and blocking electrons with a bandgap of at least about 3 eV adjacent a surface of the emissive layer opposite the first layer, and disposing an anode over the second layer.

Preferably the method further comprises heat treating the partial device after formation of the emissive layer, prior to inclusion of another layer thereover.

In certain embodiments, the method further comprises disposing a third layer comprising a material capable of transporting holes over the second layer before inclusion of the anode.

In certain embodiments, the method further comprises disposing a hole injection layer over the uppermost layer prior to including the anode.

In certain embodiment, the method further includes encapsulating the device.

In certain preferred embodiments the electron-injection layer comprises zinc oxide.

In certain embodiments, the second layer comprises a small molecule material.

In certain embodiments, the third layer comprises a small molecule material.

In certain embodiments, the first layer is sufficiently thick to inhibit emission from device materials other than quantum dots.

In certain embodiments, the first layer has a thickness greater than 25 nm.

In certain preferred embodiments, the emissive layer is formed by phase separation of the quantum dots capable of emitting blue light upon excitation from the small molecule material included in the first layer.

In accordance with another aspect of the present invention, there is provided a light emitting device prepared in accordance with a method described herein.

In certain embodiments of the device, the CIE x and y coordinates of blue light emitted from the quantum dots are less than about 0.15 and less than about 0.1, respectively.

In accordance with another aspect of the present invention, there is provided a light emitting device comprising: an electron-injection layer comprising a metal oxide disposed on a cathode, a first layer disposed adjacent the electron-injection layer, the first layer comprising a small molecule material with a bandgap of at least about 3 eV capable of blocking holes, an emissive layer comprising quantum dots capable of emitting blue light upon excitation disposed at a surface of the first layer opposite the electron-injection layer; a second layer comprising a material capable of transporting holes and blocking electrons with a bandgap of at least about 3 eV disposed adjacent a surface of the emissive layer opposite the first layer, and an anode disposed over the second layer.

Preferably the emissive layer is annealed prior to inclusion of another layer thereover.

In certain embodiments, the device further comprises a third layer comprising a material capable of transporting holes disposed over the second layer before inclusion of the anode.

In certain embodiments, the device further comprises a hole injection layer disposed over the uppermost layer prior to including the anode.

In certain preferred embodiments the electron-injection layer comprises zinc oxide.

In certain embodiments, the first layer is sufficiently thick to inhibit emission from device materials other than quantum dots.

In certain embodiments, the first layer has a thickness greater than 25 nm.

In certain preferred embodiments, the emissive layer is formed by phase separation of the quantum dots capable of emitting blue light upon excitation from the small molecule material included in the first layer.

In certain embodiments of the inventions described herein, an electron-injection layer can comprise a stratified structure including two or more horizontal zones or layers.

In certain embodiments of the inventions described herein, a layer can comprise one or more separate layers.

In certain embodiments of the inventions described herein, one or more additional layers (e.g., but not limited to, charge injection, charge blocking, etc.) can be included in the device.

In certain embodiments of the inventions described herein, the material capable of transporting holes and blocking electrons comprises an inorganic material.

In certain embodiments of the inventions described herein, the material capable of transporting holes and blocking electrons comprises an organic material.

In certain embodiments of the inventions described herein, the material capable of transporting holes comprises an inorganic material.

In certain embodiments of the inventions described herein, the material capable of transporting holes comprises an organic material.

In certain embodiments of the inventions described herein, the second layer comprises a small molecule material.

In certain embodiments of the inventions described herein, the third layer comprises a small molecule material.

In certain embodiments of the inventions described herein, an electron-injection layer comprises titanium dioxide.

In certain embodiments of the inventions described herein, an electron-injection layer comprises zinc oxide.

In certain embodiments of the inventions described herein, an electron-injection layer comprises a mixture of zinc oxide and titanium oxide.

In accordance with another aspect of the invention, there are provided displays and other products including the above-described light-emitting device.

Quantum dots that can be included in a device or method taught herein can comprise quantum dots including a core comprising a first material and a shell disposed over at least a portion of, and preferably substantially all, of the outer surface of the core, the shell comprising a second material. (A quantum dot including a core and shell is also described herein as having a core/shell structure.) Optionally, more than one shell can be included on the core. The first material can preferably comprise an inorganic semiconductor material and the second material can preferably comprise an inorganic semiconductor material.

Preferably quantum dots comprise inorganic semiconductor nanocrystals. Such inorganic semiconductor nanocrystals preferably comprise a core/shell structure. In certain preferred embodiments, quantum dots comprise colloidally grown inorganic semiconductor nanocrystals.

Quantum dots typically can include a ligand attached to an outer surface thereof. In certain embodiments, two or more chemically distinct ligands can be attached to an outer surface of at least a portion of the quantum dots.

Optionally an emissive layer can include more than one type of quantum dots, wherein each type is selected to emit light having a predetermined wavelength, at least one type being capable of emitting blue light upon excitation. Other types of quantum dots, if included, can be selected to emit at any predetermined wavelength across the electromagnetic spectrum. In certain embodiments, quantum dot types can be different based on, for example, factors such composition, structure and/or size of the quantum dot.

Preferably the quantum dots capable of emitting blue light upon excitation emit blue light having a full width at half max (FWHM) no greater than about 30 nm, no greater than about 25 nm, no greater than about 20 nm. If other types of quantum dots are included in an emissive layer, such other types of quantum dots preferably emit light with a full width at half max (FWHM) no greater than about 30 nm, no greater than about 25 nm, no greater than about 20 nm.

Examples of such other types include, but are not limited to, quantum dots capable of emitting visible light and quantum dots capable of emitting infrared light.

Other aspects and embodiments of the invention relate to materials and methods that are useful in making the above described devices.

Figure 1:
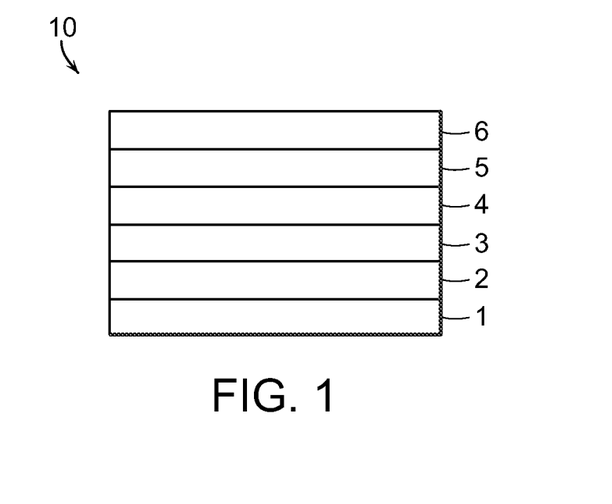
FIG. 1 is schematic drawing depicting an example of an embodiment of a light-emitting device structure in accordance with the invention; actual structures may differ in numerous respects, including, e.g., relative scale, etc.

FIG. 1 provides a schematic representation of an example of the architecture of a light-emitting device according to one embodiment of the present invention. Referring to FIG. 1, the light-emitting device 10 includes (from bottom to top) a cathode 1, an electron-injection layer comprising a metal oxide 2, a first layer comprising a small molecule material with a bandgap of at least about 3 eV capable of blocking holes 3, an emissive layer comprising quantum dots capable of emitting blue light upon excitation 4, a second layer comprising a material capable of transporting holes and blocking electrons with a bandgap of at least about 3 eV 5, and an anode 6. (A substrate on which the device can be supported is not shown.)

The substrate (not shown) can be opaque or transparent. A transparent substrate can be used, for example, in the manufacture of a transparent light emitting device. See, for example, Bulovic, V. et al., Nature 1996, 380, 29; and Gu, G. et al., Appl. Phys. Lett. 1996, 68, 2606-2608, each of which is incorporated by reference in its entirety. The substrate can be rigid or flexible. The substrate can be plastic, metal, semiconductor wafer, or glass. The substrate can be a substrate commonly used in the art. Preferably the substrate has a smooth surface. A substrate surface free of defects is particularly desirable.

The cathode can be formed on the substrate (not shown). In certain embodiments, a cathode can comprise ITO, aluminum, silver, gold, etc. The cathode preferably comprises a material with a work function chosen with regard to the quantum dots included in the device and/or any electron transport layer included in the device.

Substrates including patterned ITO are commercially available and can be used in making a device according to the present invention.

An electron-injection layer comprising a metal oxide is disposed adjacent the cathode.

Examples of metal oxides that can be included in the electron-injection layer can include, without limitation, zinc oxide, a titanium oxide, a niobium oxide, an indium tin oxide, copper oxide, nickel oxide, vanadium oxide, chromium oxide, indium oxide, tin oxide, gallium oxide, manganese oxide, iron oxide, cobalt oxide, aluminum oxide, thallium oxide, silicon oxide, germanium oxide, lead oxide, zirconium oxide, molybdenum oxide, hafnium oxide, tantalum oxide, tungsten oxide, cadmium oxide, iridium oxide, rhodium oxide, ruthenium oxide, osmium oxide, indium zinc oxide (IZO), indium gallium zinc oxide (IGZO), and aluminum zinc oxide (AZO). Mixtures of one or more metal oxides can also be included in the electron-injection layer.

In certain embodiments, the metal oxide can include a dopant.

An example of a preferred metal oxide for inclusion in the electron-injection layer of a device in accordance with the invention comprises zinc oxide. In certain embodiments, zinc oxide can be mixed or blended with one or more other inorganic materials, e.g., inorganic semiconductor materials, such as titanium oxide.

As mentioned above, in certain preferred embodiments, an electron-injection layer can comprise zinc oxide. Such zinc oxide can be prepared, for example, by a sol-gel process. In certain embodiments, the zinc oxide can be chemically modified. Examples of chemical modification include treatment with hydrogen peroxide.

In certain embodiments, an electron-injection layer can have a thickness in a range from about 10 nm to 500 nm.

Electron-injection materials comprising a metal oxide can be deposited at a low temperature, for example, by a known method, such as a vacuum vapor deposition method, an ion-plating method, sputtering, inkjet printing, sol-gel, etc. For example, sputtering is typically performed by applying a high voltage across a low-pressure gas (for example, argon) to create a plasma of electrons and gas ions in a high-energy state. Energized plasma ions strike a target of the desired coating material, causing atoms from that target to be ejected with enough energy to travel to, and bond with, the substrate.

The first layer comprises a small molecule material with a bandgap of at least about 3 eV capable of blocking holes. In certain preferred embodiments, such small molecule material comprises OXD-7. Other examples include, but are not limited to, TPPi, and BPhen. Other small molecule hole blocking materials with a bandgap of at least about 3 eV can be readily determined by those of ordinary skill in the relevant art.

The emissive material includes quantum dots capable of emitting blue light upon excitation. In certain embodiments, the quantum dots comprise an inorganic semiconductor material. In certain preferred embodiments, the quantum dots comprise crystalline inorganic semiconductor material (also referred to as semiconductor nanocrystals). Examples of inorganic semiconductor materials include, but are not limited to, Group II-VI compound semiconductor nanocrystals, and other binary, ternary, and quaternary II-VI compositions; Group III-V compound semiconductor nanocrystals, such as GaP, GaAs, InP and InAs; PbS; PbSe; PbTe, and other binary, ternary, and quaternary III-V compositions. Other non-limiting examples of inorganic semiconductor materials include Group II-V compounds, Group III-VI compounds, Group IV-VI compounds, Group compounds, Group II-IV-VI compounds, Group II-IV-V compounds, Group IV elements, an alloy including any of the foregoing, and/or a mixture including any of the foregoing. Further, materials for the quantum dot light-emitting layer may be core-shell structured nanocrystals wherein the core is composed of a first crystalline inorganic semiconductor material and the shell is composed of a second crystalline inorganic semiconductor material.

Nonlimiting examples of quantum dots capable of emitting blue light upon excitation are described in International Application No. PCT/US2007/24305, filed Nov. 21, 2007, of Breen, et al., for "Blue Light Emitting Semiconductor Nanocrystal And Compositions And Devices Including Same" and US Publication No. 2005/0258418 of Steckel et al. entitled "Blue Light Emitting Semiconducutor Nanocrsytals Materials, published 24 Nov. 2005, each of the foregoing being herein incorporated by reference in its entirety.

Quantum dots can also have various shapes, including, but not limited to, sphere, rod, disk, other shapes, and mixtures of various shaped particles.

An emissive material can comprise one or more different quantum dots, at least one of which comprises quantum dots capable of emitting blue light upon excitation. The differences can be based, for example, on different composition, different size, different structure, or other distinguishing characteristic or property.

The color of the light output of a light-emitting device can be controlled by the selection of the composition, structure, and size of the quantum dots included in a light-emitting device as the emissive material.

The emissive material is preferably included in the device as a layer. In certain embodiments, the emissive layer can comprise one or more layers of the same or different emissive material(s). In certain embodiments, the emissive layer can have a thickness in a range from about 1 nm to about 20 nm. In certain embodiments, the emissive layer can have a thickness in a range from about 1 nm to about 10 nm. In certain embodiments, the emissive layer can have a thickness in a range from about 3 nm to about 6 about nm. In certain embodiments, the emissive layer can have a thickness of about 4 nm. A thickness of 4 nm can be preferred in a device including an electron transport material including a metal oxide. Other thicknesses outside the above examples may also be determined to be useful or desirable.

An emissive material can be deposited by spin-casting, screen-printing, inkjet printing, gravure printing, roll coating, drop-casting, Langmuir-Blodgett techniques, contact printing, slot die coating, spray coating, or other techniques known or readily identified by one skilled in the relevant art.

In certain preferred embodiments, the emissive layer is formed by phase separation from a mixture comprising the small molecule material with a bandgap of at least about 3 eV capable of blocking holes and quantum dots. Such technique is known to those of ordinary skill in the relevant art. See, for example, U.S. Pat. No. 7,332,211 entitled "Layered Materials Including Nanoparticles", of Bulovic et al, issued 19 Feb. 2008, which is hereby incorporated herein by reference in its entirety.

As described above, after formation of the emissive layer, the partially formed device is preferably heat treated prior to inclusion of another layer thereover. For example, after the emissive layer is formed, the partially formed device can be heat treated at a temperature in a range from about 80° C. to about 160° C. in the absence of oxygen for a period of time of at least about 5 minutes. Examples of heating times, include, for example from about 5 to about 30 minutes, from 5 to about 45 minutes, etc, Other times and temperatures outside of these ranges may be determined by the skilled artisan to be desirable or useful.

Other treatments of the quantum dot layer may also be utilized, including, for examples, those described in International Publication No. WO 2011/060180 of QD Vision, Inc., entitled "Devices Including Quantum Dots", published 19 May 2011, which is hereby incorporated herein by reference in its entirety.

In certain embodiments, an emissive layer can further include a host matrix in which the quantum dots are dispersed.

Preferably, the quantum dots include one or more ligands attached to the surface thereof. In certain embodiments, a ligand can include an alkyl (e.g., $C_1$-$C_{20}$) species. In certain embodiments, an alkyl species can be straight-chain, branched, or cyclic. In certain embodiments, an alkyl species can be substituted or unsubstituted. In certain embodiments, an alkyl species can include a hetero-atom in the chain or cyclic species. In certain embodiments, a ligand can include an aromatic species. In certain embodiments, an aromatic species can be substituted or unsubstituted. In certain embodiments, an aromatic species can include a hetero-atom. Additional information concerning ligands is provided herein and in various of the documents which are incorporated herein by reference.

By controlling the structure, shape and size of quantum dots during preparation, energy levels over a very broad range of wavelengths can be obtained while the properties of the bulky materials are varied. Quantum dots (including but not limited to semiconductor nanocrystals) can be prepared by known techniques. Preferably they are prepared by a wet chemistry technique wherein a precursor material is added to a coordinating or non-coordinating solvent (typically organic) and nanocrystals are grown so as to have an intended size. According to the wet chemistry technique, when a coordinating solvent is used, as the quantum dots are grown, the organic solvent is naturally coordinated to the surface of the quantum dots, acting as a dispersant. Accordingly, the organic solvent allows the quantum dots to grow to the nanometer-scale level. The wet chemistry technique has an advantage in that quantum dots of a variety of sizes can be uniformly prepared by appropriately controlling the concentration of precursors used, the kind of organic solvents, and preparation temperature and time, etc.

A coordinating solvent can help control the growth of quantum dots. The coordinating solvent is a compound having a donor lone pair that, for example, has a lone electron pair available to coordinate to a surface of the growing quantum dots. Solvent coordination can stabilize the growing quantum dot. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for quantum dot production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri(dodecyl)phosphine, dibutylphosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl) amine, octylamine, dioctylamine, trioctylam ine, dodecylamine/laurylamine, didodecylam ine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. In certain embodiments, technical grade TOPO can be used.

Quantum dots can alternatively be prepared with use of non-coordinating solvent(s).

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of quantum dots can be further refined by size selective precipitation with a poor solvent for the quantum dots, such as methanol/butanol as described in U.S. Pat. No. 6,322,901. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot population preferably has no more than a 15% rms deviation from mean diameter, more preferably 10% rms deviation or less, and most preferably 5% rms deviation or less.

In certain embodiments, quantum dots preferably have ligands attached thereto.

In certain embodiment, the ligands can be derived from the coordinating solvent used during the growth process.

In certain embodiments, the surface can be modified by repeated exposure to an excess of a competing coordinating group to form an overlayer.

For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

More specifically, the coordinating ligand can have the formula:

wherein k is 2, 3 4, or 5, and n is 1, 2, 3, 4 or 5 such that k-n is not less than zero; X is O, O—S, O—Se, O—N, O—P, O—As, S, S═O, SO$_2$, Se, Se═O, N, P, P═O, C═O As, or As═O; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)-, —N(Ra)-C(O)—O—, —O—C(O)—N(Ra)-, —N(Ra)-C(O)—N(Rb)-, —O—C(O)—O—, —P(Ra)-, or —P(O)(Ra)-. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

A suitable coordinating ligand can be purchased commercially or prepared by ordinary synthetic organic techniques, for example, as described in J. March, Advanced Organic Chemistry.

Other ligands are described in U.S. patent application Ser. No. 10/641,292 for "Stabilized Semiconductor Nanocrystals", filed 15 Aug. 2003, which issued on 9 Jan. 2007 as U.S. Pat. No. 7,160,613, which is hereby incorporated herein by reference in its entirety.

Other examples of ligands include benzylphosphonic acid, benzylphosphonic acid including at least one substituent group on the ring of the benzyl group, a conjugate base of such acids, and mixtures including one or more of the foregoing. In certain embodiments, a ligand comprises 4-hydroxybenzylphosphonic acid, a conjugate base of the acid, or a mixture of the foregoing. In certain embodiments, a ligand comprises 3,5-di-tert-butyl-4-hydroxybenzylphosphonic acid, a conjugate base of the acid, or a mixture of the foregoing.

Additional examples of ligands that may be useful with the present invention are described in International Application No. PCT/US2008/010651, filed 12 Sep. 2008, of Breen, et al., for "Functionalized Nanoparticles And Method" and International Application No. PCT/US2009/004345, filed 28 Jul. 2009 of Breen et al., for "Nanoparticle Including Multi-Functional Ligand And Method", each of the foregoing being hereby incorporated herein by reference.

The emission from a quantum dot capable of emitting light (e.g., a semiconductor nanocrystal) can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light (e.g., semiconductor nanocrystals) can result in emission of light in a narrow spectral range. The population can be monodisperse preferably exhibits less than a 15% rms (root-mean-square) deviation in diameter of such quantum dots, more preferably less than 10%, most preferably less than 5%. Spectral emissions in a narrow range of no greater than about 75 nm, no greater than about 60 nm, no greater than about 40 nm, no greater than about 30 nm, no greater than about 25 nm, no greater than about 20 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

For example, semiconductor nanocrystals can have high emission quantum efficiencies such as greater than 10%, 20%, 30%, 40%, 50%, 60%, 70%, 80%, or 90%.

The narrow FWHM of semiconductor nanocrystals can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A pattern including more than one size of semiconductor nanocrystal can emit light in more than one narrow range of wavelengths. The color of emitted light perceived by a viewer can be controlled by selecting appropriate combinations of semiconductor nanocrystal sizes and materials. The degeneracy of the band edge energy levels of semiconductor nanocrystals facilitates capture and radiative recombination of all possible excitons.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

The second layer comprises a material capable of transporting holes and blocking electrons with a bandgap of at least about 3 eV.

In certain embodiments, the second layer comprises a small molecule material capable of transporting holes and blocking electrons with a bandgap of at least about 3 eV.

In certain preferred embodiments, the second layer comprises tris(4-carbazoyl-9-ylphenyl)amine (TCTA).

Other small molecule material capable of transporting holes and blocking electrons with a bandgap of at least about 3 eV can be identified by the person of ordinary skill in the relevant The second layer comprising a material capable of transporting holes and blocking electrons with a bandgap of at least about 3 eV can have a thickness in a range from about 10 nm to about 500 nm.

As discussed above, the device can further include a third layer comprising a material capable of transporting holes that is disposed over the second layer.

Examples of hole transport materials include organic material and inorganic materials. An example of an organic material that can be included in a hole transport layer includes an organic chromophore. The organic chromophore can include a phenyl amine, such as, for example, N,N'-diphenyl-N,N'-bis(3-methylphenyl)-(1,1'-biphenyl)-4,4'-diamine (TPD). Other hole transport layer can include (N,N'-bis(3-methylphenyl)-N,N'-bis(phenyl)-spiro (spiro-TPD), 4-4'-N,N'-dicarbazolyl-biphenyl (CBP), 4,4-. bis[N-(1-naphthyl)-N-phenylamino]biphenyl (NPD), etc., a polyaniline, a polypyrrole, a poly(phenylene vinylene), copper phthalocyanine, an aromatic tertiary amine or polynuclear aromatic tertiary amine, a 4,4'-bis(p-carbazolyl)-1,1'-biphenyl compound, N,N,N',N'-tetraarylbenzidine, poly(3,4-ethylenedioxythiophene) (PEDOT)/polystyrene para-sulfonate (PSS) derivatives, poly-N-vinylcarbazole derivatives, polyphenylenevinylene derivatives, polyparaphenylene derivatives, polymethacrylate derivatives, poly(9,9-octylfluorene) derivatives, poly(spiro-fluorene) derivatives, N,N'-di(naphthalene-1-yl)-N,N'-diphenyl-benzidine (NPB), tris(3-methylphenylphenylamino)-triphenylamine (m-MTDATA), and poly(9,9'-dioctylfluorene-co-N-(4-butylphenyl)diphenylamine (TFB), and 2,2',7,7'-tetrakis[N-naphthalenyl(phenyl)-amino]-9,9-spirobifluorene (spiro-2NPB).

In certain embodiments of the inventions described herein, a hole transport layer can comprise an inorganic material. Examples of inorganic materials include, for example, inorganic semiconductor materials capable of transporting holes. The inorganic material can be amorphous or polycrystalline. Examples of such inorganic materials and other information related to fabrication of inorganic hole transport materials that may be helpful are disclosed in International Application No. PCT/US2006/005184, filed 15 Feb. 2006, for "Light Emitting Device Including Semiconductor Nanocrystals, which published as WO 2006/088877 on 26 Aug. 2006, the disclosure of which is hereby incorporated herein by reference in its entirety.

Hole transport materials comprising, for example, an inorganic material such as an inorganic semiconductor material, can be deposited at a low temperature, for example, by a known method, such as a vacuum vapor deposition method, an ion-plating method, sputtering, inkjet printing, sol-gel, etc.

Organic hole transport materials may be deposited by known methods such as a vacuum vapor deposition method, a sputtering method, a dip-coating method, a spin-coating method, a casting method, a bar-coating method, a roll-coating method, and other film deposition methods. Preferably, organic layers are deposited under ultra-high vacuum (e.g., $\leq 10^{-8}$ torr), high vacuum (e.g., from about $10^{-8}$ torr to about $10^{-5}$ torr), or low vacuum conditions (e.g., from about $10^{-5}$ torr to about $10^{-3}$ torr).

Hole transport materials comprising organic materials and other information related to fabrication of organic charge transport layers that may be helpful are disclosed in U.S. patent application Ser. No. 11/253,612 for "Method And System For Transferring A Patterned Material", filed 21 Oct. 2005, and Ser. No. 11/253,595 for "Light Emitting Device Including Semiconductor. Nanocrystals", filed 21 Oct. 2005, each of which is hereby incorporated herein by reference in its entirety.

The third layer comprising a hole transport material can have a thickness in a range from about 10 nm to about 500 nm.

Device 10 can further include a hole-injection material. The hole-injection material may comprise a separate hole injection material or may comprise an upper portion of the hole transport layer that has been doped, preferably p-type doped. The hole-injection material can be inorganic or organic. Examples of organic hole injection materials include, but are not limited to, LG-101 (see, for example, paragraph (0024) of EP 1 843 411 A1) and other HIL materials available from LG Chem, LTD. Additional examples of HIL materials include 1,4,5,8,9,11-hexaazatriphenylene-hexacarbonitrile (HAT-CN) and molybdenum oxide hole-injection materials. Other organic hole injection materials can be used. Examples of p-type dopants include, but are not limited to, stable, acceptor-type organic molecular material, which can lead to an increased hole conductivity in the doped layer, in comparison with a non-doped layer. In certain embodiments, a dopant comprising an organic molecular material can have a high molecular mass, such as, for example, at least 300 amu. Examples of dopants include, without limitation, $F_4$-TCNQ, $FeCl_3$, etc. Examples of doped organic materials for use as a hole injection material include, but are not limited to, an evaporated hole transport material comprising, e.g., 4,4',4"-tris(diphenylamino)triphenylamine (TDATA) that is doped with tetrafluoro-tetracyano-quinodimethane ($F_4$-TCNQ); p-doped phthalocyanine (e.g., zinc-phthalocyanine (ZnPc) doped with $F_4$-TCNQ (at, for instance, a molar doping ratio of approximately 1:30); N,N'-diphenyl-N,N'-bis(1-naphthyl)-1,1'biphenyl-4,4"diamine (alpha-NPD) doped with $F_4$-TCNQ. See J. Blochwitz, et al., "Interface Electronic Structure Of Organic Semiconductors With Controlled Doping Levels", Organic Electronics 2 (2001) 97-104; R. Schmechel, 48, Internationales Wissenschaftliches Kolloquium, Technische Universtaat Ilmenau, 22-25 Sep. 2003; C. Chan et al., "Contact Potential Difference Measurements Of Doped Organic Molecular Thin Films", J. Vac, Sci. Technol. A 22(4), July/August 2004. The disclosures of the foregoing papers are hereby incorporated herein by reference in their entireties. See also, Examples of p-type doped inorganic hole transport materials are described in U.S. Patent Application No. 60/653,094 entitled "Light Emitting Device Including Semiconductor Nanocrystals, filed 16 Feb. 2005, which is hereby incorporated herein by reference in its entirety. Examples of p-type doped organic hole transport materials are described in U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

As shown in FIG. 1, anode 6 may comprise an electrically conductive metal or its oxide that can easily inject holes. Examples include, but are not limited to, ITO, aluminum, aluminum-doped zinc oxide (AZO), silver, gold, etc. Other suitable anode materials are known and can be readily ascertained by the skilled artisan. The anode material can be deposited using any suitable technique. In certain embodiments, the anode can be patterned.

In certain embodiments, the surface of an electron-injection layer comprising a metal oxide can be treated with ozone to promote adhesion of the layer to be disposed thereon. Other known adhesion promotion techniques can be used.

In certain embodiments, the electrode (e.g., anode or cathode) materials and other materials are selected based on the light transparency characteristics thereof so that a device can be prepared that emits light from the top surface thereof. A top emitting device can be advantageous for constructing an active matrix device (e.g., a display). In certain embodiments, the electrode (e.g., anode or cathode) materials and other materials are selected based on light transparency characteristics thereof so that a device can be prepared that emits light from the bottom surface thereof.

The device can also be fabricated in the reverse order with the anode on the bottom and cathode on the top using known techniques in the art.

As mentioned above, the device can further include a substrate (not shown in the figure). Examples of substrate materials include, without limitation, glass, plastic, insulated metal foil.

In certain embodiments, a device can further include a passivation or other protective layer that can be used to protect the device from the environment. For example, a protective glass layer can be included to encapsulate the device. Optionally a desiccant or other moisture absorptive material can be included in the device before it is sealed, e.g., with an epoxy, such as a UV curable epoxy. Other desiccants or moisture absorptive materials can be used.

The present invention will be further clarified by the following non-limiting example(s), which are intended to be exemplary of the present invention.

EXAMPLES

QLED Device Fabrication Examples

Electron-Injection Layer (EIL) Material Synthesis:

An electron transport layer comprising zinc oxide is prepared from a solution of 12.56 g of zinc acetate [Zn(ac)] dehydrate (Aldrich, 99.999% purity), 76.8 ml of 2-methoxyethanol anhydrous 99.8% and 3.2 ml of ethanolamine redistilled 99.5+%. The Zn(ac) solution is then mixed and shaken or magnetically stirred for 3 hours on a stirring plate and then an ultrasonic agitation is applied for 2 hours in a DI water filled bath.

QLED Fabrication:

Light emitting devices are fabricated with CdZnS/ZnS core-shell quantum dots capable of emitting blue light upon excitation. Such quantum dots can be prepared as set forth in International Application No. PCT/US2007/24305, filed Nov. 21, 2007, of Breen, et al., for "Blue Light Emitting Semiconductor Nanocrystal And Compositions And Devices Including Same", which is hereby incorporated herein by reference in its entirety.

The devices are made as follows. Glass (50 mm×50 mm in area) with patterned indium tin oxide (ITO) electrodes on one surface is cleaned ultrasonically using sequential immersions in de-ionized water, acetone and isopropyl alcohol baths, which is followed by cleaning with oxygen plasma for 6 minutes to remove contaminants. The electron-injection layer (EIL) solution is spun coated at 2000 rpm onto the ITO. Subsequent annealing at 300° C. on a hot plate for 5-15 minutes in air converts Zn(ac) to Zinc oxide. After baking, the annealed ZnO layer is rinsed with de-ionized water and methanol to remove any residual organic material from the surface. The thickness of ZnO layer is approximately 50 nm.

The substrate is then transferred into nitrogen-filled glove box, which normally has oxygen and water levels below 1 ppm.

A coating formulation including quantum dots capably of emitting blue light upon excitation blended with wide bandgap hosts (e.g., OXD-7) in chloroform (or chlorobenzene, or toluene) is spin coated on the ZnO surface at 2000 rpm for about 30 seconds. Pristine films would be defined mostly by the spontaneous vertical phase separation with most organic small molecules sit between ZnO layer and the QDs-rich layer.

Devices designated as "pre-baked" in the figures include a quantum dot layer that is baked in the absence of oxygen at 120° C. for 15 (or, e.g., from about 5-30) minutes on a hotplate (or in a vacuum oven) to remove the solvent residual and to adjust the QDs:host distribution and density on ZnO layer.

While not wishing to be bound by theory, during this baking step, it is believed that the small molecules host will fill more densely to the voids on ZnO surface to get better contact thus better electron injection, and/or the QDs settle with the organic host to get a better contact or partly sit into the organic host. In this way it is believed that the leaking current originated from ZnO surface non-smoothness and voids on pristine QDs:host films could be greatly diminished, thus yielding much pure QDs emission in the EL without or almost without side emission from either HTL or impurities in ZnO.

A 20 nm thick of electron-blocking/hole-transporting layer (EBL/HTL1, representatively by TCTA) is thermally deposited first, then a 35 nm thick of hole transport layer (HTL2, representatively by s-2NPB) is evaporated onto the QD:host emissive layer, followed with a 15 nm thick of hole injection layer (representatively LG-101, available from LG Chem, LTD).

Finally, a 100 nm thick Al anode is deposited to complete the device. The package is then environmentally sealed using a UV-curable epoxy.

The following table summarizes the structures of devices prepared generally as described above:

| Sample ID | Structure |
| --- | --- |
| NY080527A | ITO/ZnO/B13(OD1, 2K, pristine)/TCTA**(20 nm)/S-2TPD(35 nm)/LG101(15 nm)/Al |
| NY080527G | ITO/ZnO/B15(OD1, 2K, pre-baked 120° C.-15 min)/TCTA(20 nm)/S-2TPD(35 nm)/LG101(15 nm)/Al |

**Thermally deposited wide bandgap TCTA layer functions as EBL/HTL1

The following provides information regarding first layers and emissive layers formed by phase-separation, which are designated in the above table as B13 and B15.

Film forming solutions with QDs:host ratio:

| Blend # | QD Batch | QD OD* | Host (OXD-7) | To Yield |
| --- | --- | --- | --- | --- |
| B13 | B145 | 1 | 4 mg/ml | Thicker (15~30~45 nm) HBL |
| B15 | B144 | 1 | 4 mg/ml | Thicker (15~30~45 nm) HBL |

*Optical Density (OD) (at first excitonic absorption peak) of the QDs in the spin-coating solutions.

QD Batch B145 (4 times crashed out) has a thinner shell than QD Batch 144 (2 times crashed out).

Description of the Pre-Baking:

For QLEDs NY080527G, after spin-coating, the films (on substrate with pre-formed ZnO on patterned ITO glass) composed of the blue QDs and the wide bandgap host (OXD-7) were pre-baked on hotplate (vacuum oven as well) at 120° C. for 15 min in $N_2$-circulated glovebox.

Figure 2A:
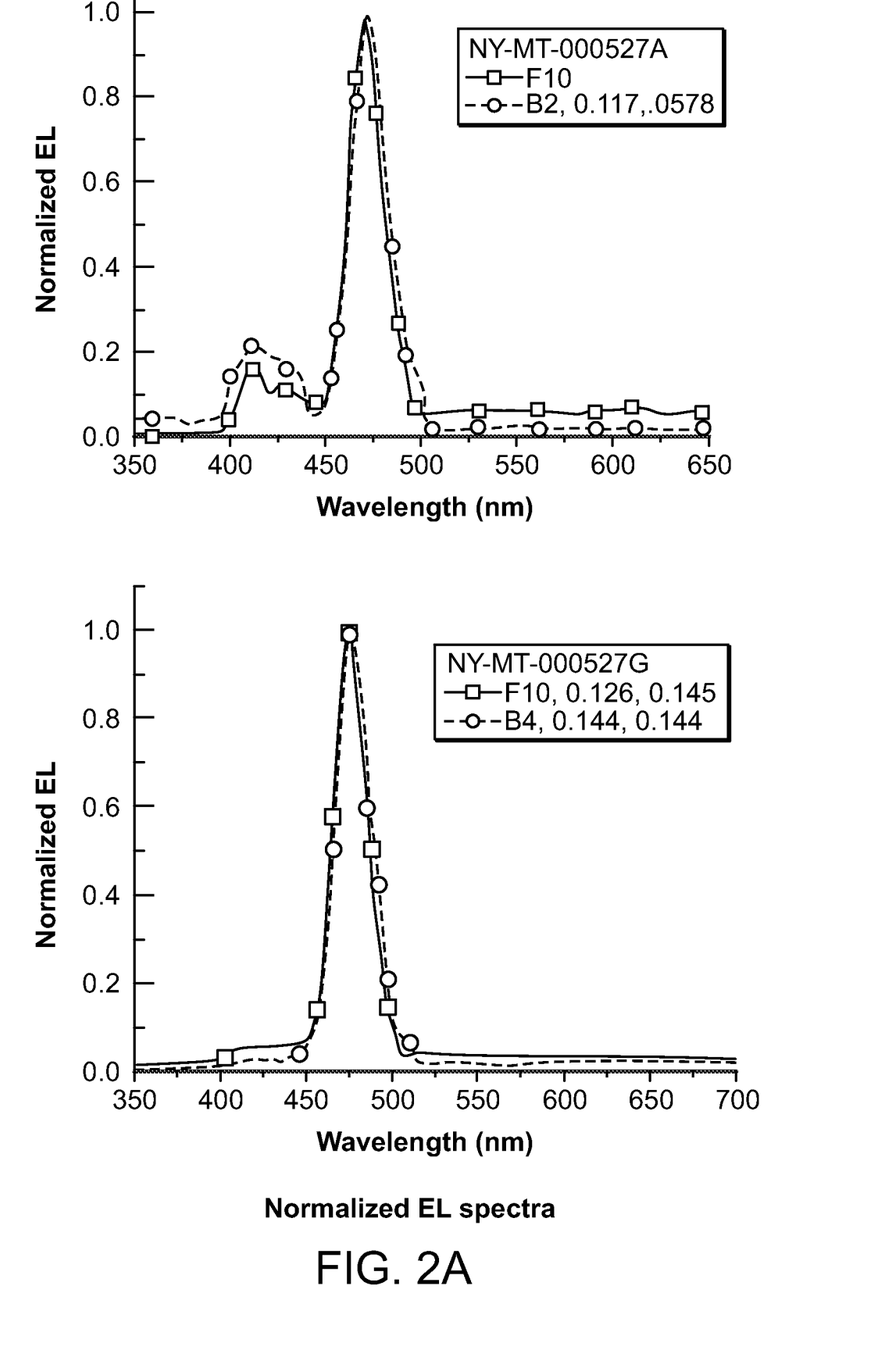
FIGS. 2A, 2B, and 2C graphically depict exemplary performance data for samples described in the Examples.
Figure 2B:
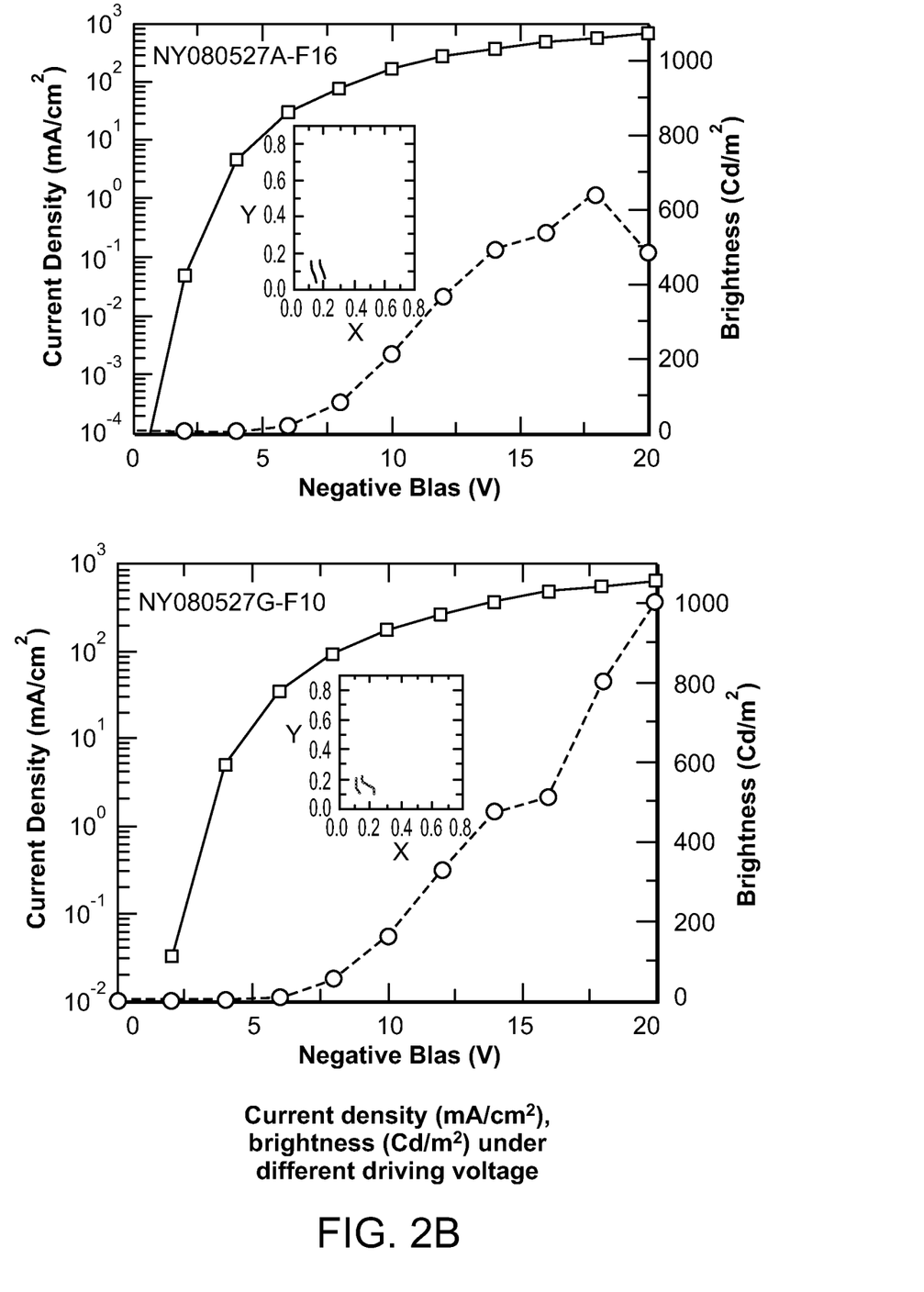
Figure 2C:
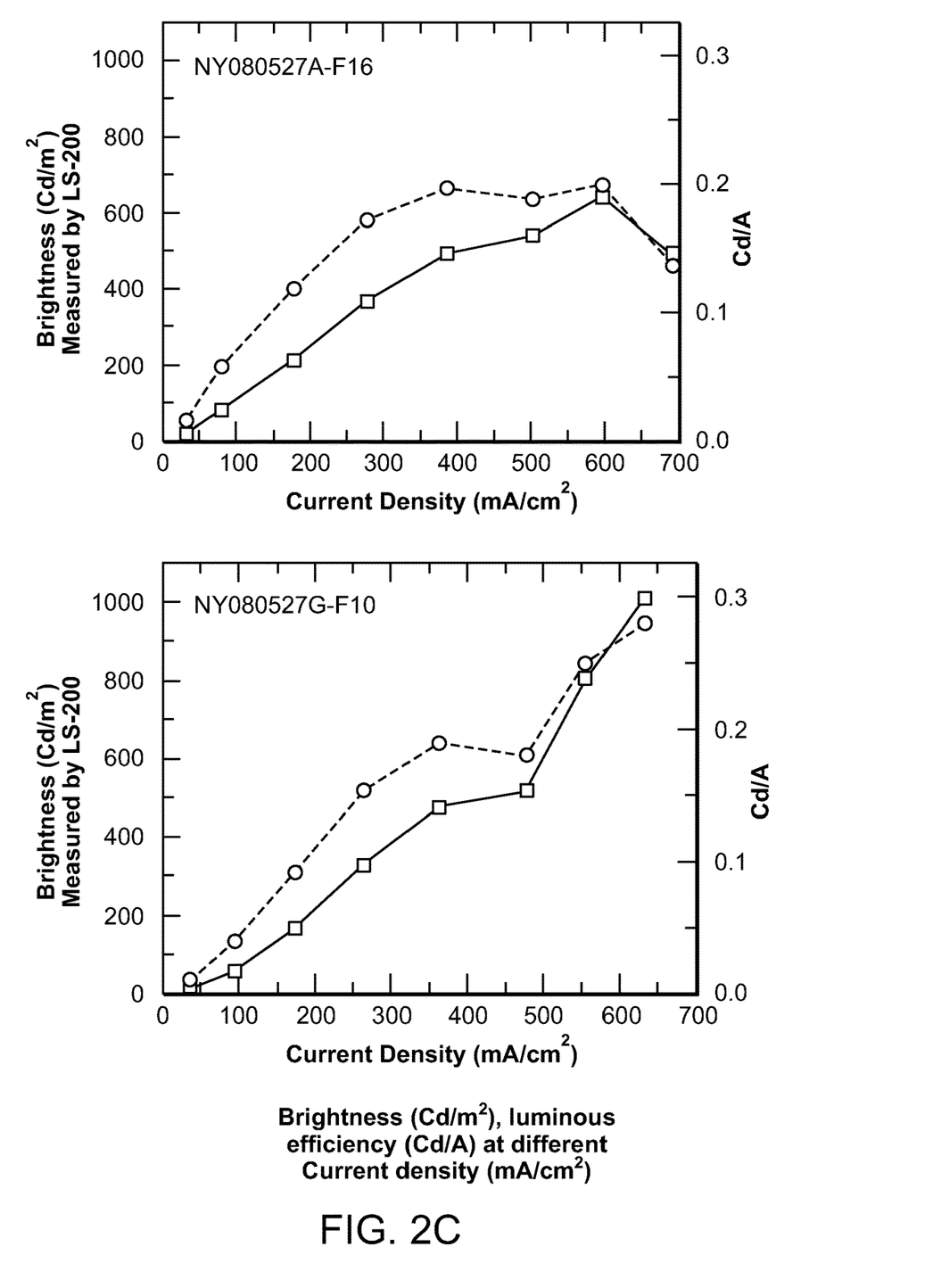

FIGS. 2A, 2B, and 2C illustrate performance results for light emitting devices prepared generally in accordance with Samples NY080527A and NY080527G above. In FIG. 2A, in the graphs relating to normalized EL spectra, "F" corresponds to a pixel having a size of 9 $mm^2$ and "B" corresponds a pixel having a size of 1.1 $mm^2$. In FIG. 2B, in the two graphs relating to current density and brightness under different driving voltage, the uppermost curve (squares) on each of the two graphs corresponds to current density data with the other curve (circles) corresponding to brightness data. (The inset provides CIE x, y data.) In FIG. 2C, in the two graphs relating to brightness and luminous efficiency at different current density, the uppermost curve (circles) on each of the two graphs corresponds to luminous efficiency data with the other curve (squares) corresponding to brightness data.

The device performance testing results shown in FIGS. 2A, 2B, and 2C are generally measured as follows:

Quantum dot photoluminescence spectra are measured using a Cary Eclipse fluorescence spectrophotometer. QLED devices are fabricated on custom ITO-glass substrates with pixel sizes ranging from 1.1 $mm^2$ (B pixel in the figures) to 18 $mm^2$ (B pixel in the figures). Device light-current-voltage (L-I-V) and external quantum efficiency (EQE) measurements are made in a dark box using a Keithley 2602 Source Meter and a large area silicon photodetetector, using previously established techniques. Color measurements and luminance measurements are made using a calibrated Konica- Minolta CS-200 Chromameter. The EL spectra are captured using an Ocean Optics spectrometer.

Other information and techniques described herein and incorporated by reference can also be useful in practicing a method in accordance with the present invention.

Light-emitting devices in accordance with various embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, a sign, lamps and various solid state lighting devices.

Other materials, techniques, methods, applications, and information that may be useful with the present invention are described in: International Application No. PCT/US2007/008873, filed Apr. 9, 2007, of Coe-Sullivan et al., for "Composition Including Material, Methods Of Depositing Material, Articles Including Same And Systems For Depositing Material"; International Application No. PCT/US2007/003411, filed Feb. 8, 2007, of Beatty, et al., for "Device Including Semiconductor Nanocrystals And A Layer Including A Doped Organic Material And Methods"; International Application No. PCT/US2007/008721, filed Apr. 9, 2007, of Cox, et al., for "Methods Of Depositing Nanomaterial & Methods Of Making A Device; International Application No. PCT/US2007/24305, filed Nov. 21, 2007, of Breen, et al., for "Blue Light Emitting Semiconductor Nanocrystal And Compositions And Devices Including Same"; International Application No. PCT/US2007/013152, filed Jun. 4, 2007, of Coe-Sullivan, et al., for "Light-Emitting Devices And Displays With Improved Performance"; International Application No. PCT/US2007/24310, filed Nov. 21, 2007, of Kazlas, et al., for "Light-Emitting Devices And Displays With Improved Performance"; International Application No. PCT/US2007/003677, filed Feb. 14, 2007, of Bulovic, et al., for "Solid State Lighting Devices Including Semiconductor Nanocrystals & Methods", U.S. Patent Application No. 61/016,227, filed 21 Dec. 2007, of Coe-Sullivan et al., for "Compositions, Optical Component, System Including an Optical Component, and Devices", U.S. Patent Application No. 60/949,306, filed 12 Jul. 2007, of Linton, et al., for "Compositions, Methods For Depositing Nanomaterial, Methods For Fabricating A Device, And Methods For Fabricating An Array Of Devices", U.S. Patent Application No. 60/992,598, filed 5 Dec. 2007, International Application No. PCT/US2009/002123, of Zhou, et al. for "Light Emitting Device Including Quantum Dots", filed 3 Apr. 2009, and International Application No. PCT/US2010/051867 of QD Vision, Inc. for "Device Including Quantum Dots", filed 7 Oct. 2010. The disclosures of each of the foregoing listed patent documents are hereby incorporated herein by reference in their entireties.

As used herein, the singular forms "a", "an" and "the" include plural unless the context clearly dictates otherwise. Thus, for example, reference to an emissive material includes reference to one or more of such materials.

As used herein, "top" and "bottom" are relative positional terms, based upon a location from a reference point. More particularly, "top" means furthest away from the substrate, while "bottom" means closest to the substrate. For example, for a light-emitting device including two electrodes, the bottom electrode is the electrode closest to the substrate, and is generally the first electrode fabricated; the top electrode is the electrode that is more remote from the substrate, on the top side of the light-emitting material. The bottom electrode has two surfaces, a bottom surface closest to the substrate, and a top surface further away from the substrate. Where, e.g., a first layer is described as disposed or deposited "over" a second layer, there may be layers between the first and second layer, unless it is otherwise specified. For example, a cathode may be described as "disposed over" an anode, even though there are various organic and/or inorganic layers in between.

The entire contents of all patent publications and other publications cited in this disclosure are hereby incorporated herein by reference in their entirety. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

The invention claimed is:

1. A method for preparing a light emitting device comprising:
    disposing an electron-injection layer comprising zinc oxide directly on a cathode comprising an indium tin oxide;
    disposing a first layer directly adjacent the electron-injection layer, the first layer comprising a small molecule material with a bandgap of at least about 3 eV capable of blocking holes;
    forming an emissive layer comprising quantum dots capable of emitting blue light upon excitation and disposed directly on a surface of the first layer and opposite the electron-injection layer;
    disposing a second layer comprising a material capable of transporting holes and blocking electrons with a bandgap of at least about 3 eV directly adjacent a surface of the emissive layer opposite the first layer; and
    disposing an anode over the second layer.

2. A method in accordance with claim 1, further comprising heat treating after formation of the emissive layer, prior to inclusion of another layer thereover.

3. A method in accordance with claim 1, further comprising disposing a third layer comprising a material capable of transporting holes over the second layer before inclusion of the anode.

4. A method in accordance with claim 3, wherein the third layer comprises a small molecule material.

5. A method in accordance with claim 1, further comprising disposing a hole injection layer over an uppermost layer prior to including the anode.

6. A method for preparing a light emitting device in accordance with claim 1, further comprising encapsulating the device.

7. A method in accordance with claim 1, wherein the electron-injection layer comprises zinc oxide.

8. A method in accordance with claim 1, wherein the second layer comprises a small molecule material.

9. A method in accordance with claim 1, wherein first layer inhibits emission from device materials other than the quantum dots.

10. A method in accordance with claim 1, wherein the emissive layer is formed by phase separation of the quantum dots capable of emitting blue light upon excitation from the small molecule material included in the first layer.

11. A method in accordance with claim 2, wherein the heat treating comprises annealing in the absence of air at a temperature of at least about 80° C. for a period of time of at least 5 minutes.

12. A light emitting device comprising:
an electron-injection layer comprising zinc oxide disposed in direct contact with a cathode comprising an indium tin oxide;
a first layer disposed directly adjacent the electron-injection layer, the first layer comprising a small molecule hole blocking material with a bandgap of at least about 3 eV;
an emissive layer comprising quantum dots that emit blue light upon excitation and are disposed directly on a surface of the first layer and opposite the electron-injection layer;
a second layer comprising a material that transports holes and blocks electrons with a bandgap of at least about 3 eV disposed directly adjacent a surface of the emissive layer opposite the first layer; and
an anode disposed over the second layer.

13. A light emitting device in accordance with claim 12, wherein the light emitting device further comprises a third layer comprising a hole transport material disposed over the second layer before inclusion of the anode.

14. A light emitting device in accordance with claim 12, wherein the light emitting device further comprises a hole injection layer disposed over an uppermost layer prior to including the anode.

15. A light emitting device in accordance with claim 12, wherein the first layer inhibits emission from device materials other than the quantum dots.

16. A light emitting device in accordance with claim 12, wherein the first layer has a thickness greater than 25 nm and less than or equal to 45 nm.

17. A light emitting device in accordance with claim 12, wherein the quantum dots emit blue light having a full width at half maximum not greater than about 30 nm upon excitation.

18. A light emitting device in accordance with claim 12, wherein CIE x and y coordinates of blue light emitted from the quantum dots are less than about 0.15 and less than about 0.1, respectively.

19. A light emitting device in accordance with claim 12, wherein the emissive layer is annealed prior to inclusion of another layer thereover.

20. A light emitting device in accordance with claim 12, wherein the small molecule hole blocking material comprises OXD7, TPPi, or BPhen.

21. A light emitting device in accordance with claim 12, wherein the light emitting device shows substantially no side emission.

22. A light emitting device in accordance with claim 12, wherein the cathode essentially consists of indium tin oxide.

23. A light emitting device in accordance with claim 12, wherein the electron-injection layer has a thickness of greater than or equal to about 10 nm and less than or equal to about 500 nm.

* * * * *